United States Patent [19]

Bender

[11] 4,379,273

[45] Apr. 5, 1983

[54] PULSE TRANSFORMER LASER DIODE PACKAGE

[75] Inventor: Gerald M. Bender, University City, Mo.

[73] Assignee: McDonnell Douglas Corporation, Long Beach, Calif.

[21] Appl. No.: 277,074

[22] Filed: Jun. 25, 1981

[51] Int. Cl.³ .............................................. H03H 7/38
[52] U.S. Cl. ........................................ 333/32; 333/33
[58] Field of Search ................ 336/90; 333/24 R, 32, 333/33; 330/286, 287

[56] References Cited

U.S. PATENT DOCUMENTS 3,449,704 6/1969 Matsushima et al. ......... 333/32 UX
4,012,703 3/1977 Chamberlayne ................. 333/24 R Primary Examiner—Paul L. Gensler
Attorney, Agent, or Firm—George W. Finch; John P. Scholl; Donald L. Royer

[57] ABSTRACT

A package for matching the characteristic impedance of a transmission line to the impedance of a pulsed semiconductor laser diode so that short duration pulses of light can be produced with a fast repetition rate. The package mounts the laser diode on the center post of a one turn secondary of a toroidal transformer whose multiturn primary is connected to the transmission line. Not only does this allow the matching of the characteristic impedances, but the center post provides heat sinking for the diode.

11 Claims, 3 Drawing Figures

U.S. Patent  Apr. 5, 1983  4,379,273
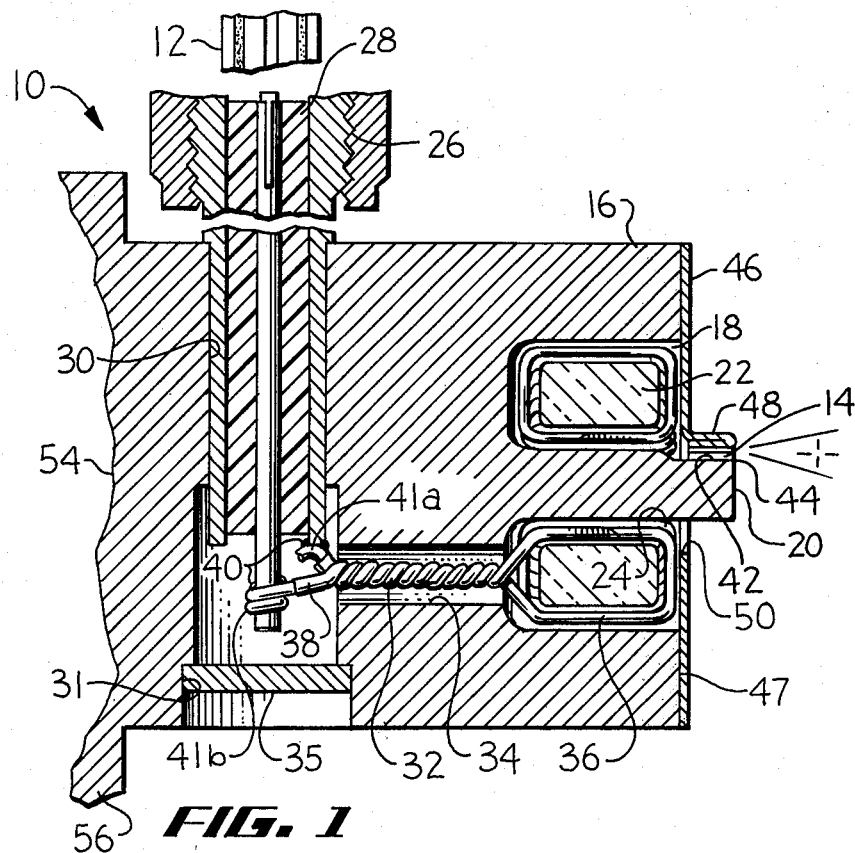
FIG. 1
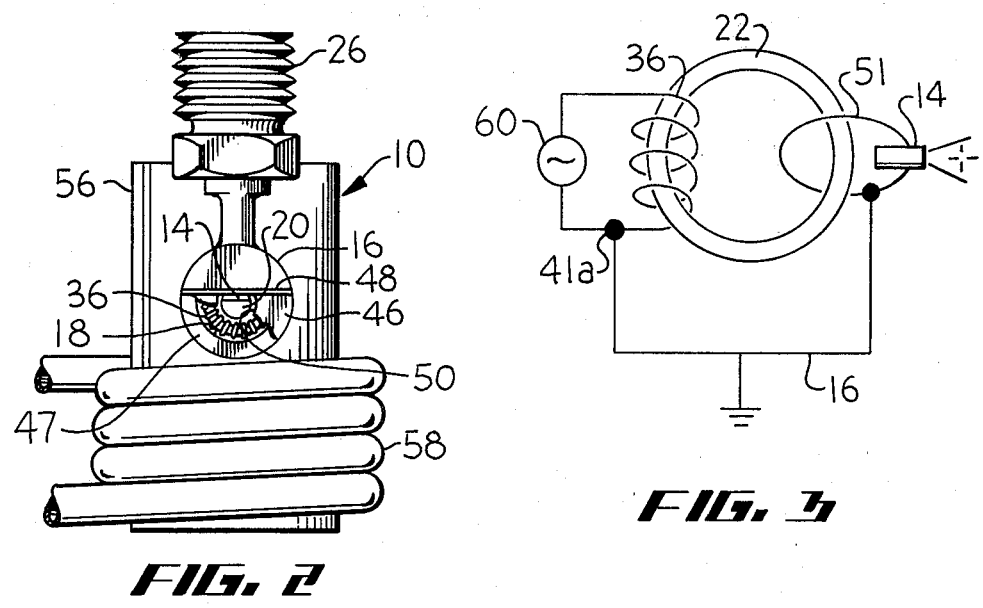
FIG. 2
FIG. 3

PULSE TRANSFORMER LASER DIODE PACKAGE

The U.S. Government has rights in this invention persuant to Contract No. F33615-76-C-1002 awarded by the Department of the Air Force.

BACKGROUND OF THE INVENTION

There are many applications where it is desired to use a driver circuit with a bipolar or field-effect transistor output stage to drive a high power pulsed semiconductor laser diode. Laser diodes typically operate with an electrical pulse of 4 volts potential, 60 amperes current, 50 nanoseconds duration, and a repetition rate of 200,000 pulses per second. The best conventional packages heretofore have approximately 10 nanohenries inductance in series with 40 milliohms resistance. Therefore 30 volts must be applied to obtain the desired maximum rise time of 20 nanoseconds, neglecting the effects of the lead from the driver to the laser package. High voltage thyristor output stages can be used to drive laser diodes in the conventional packages since they can overcome the inductance with higher voltages. Unfortunately, high pulse repetition rates cannot be achieved with a thyristor output stage.

Therefore, there has been needed a package which efficiently couples a laser diode to a transmission line having greatly differing characteristic impedance while still providing sufficient heat sinking that the laser diode can be operated at high current levels and high repetition rates.

BRIEF DESCRIPTION OF THE PRESENT INVENTION

The impedance of a typical pulsed semiconductor laser diode is about 0.1 ohm whereas transmission lines of reasonable dimensions have characteristic impedances of 50 ohms or above. To match the two together, the transmission line is connected to a ferrite toroid by a multiple turn primary winding which toroid also is provided with a single-turn secondary winding. The number of primary turns is chosen to match the characteristic impedance of the intended transmission line. The laser diode is connected to the secondary not by leads but by actual insertion into the secondary winding. The secondary winding is relatively massive serving not only as the winding but the body of the package and the heat sink for the laser diode. The end result is a package that is less lossy than any heretofore available semiconductor laser package. The present package absorbs less than 5% of the signal power whereas conventional packaging commonly absorbs as much signal power as it delivers to the laser diode. The present package offers a fast rise time of less than 5 nanoseconds without requiring excess drive voltage allowing a bipolar or field effect transistor output stage, and it provides heat sinking on both sides of the laser diode. The optimum pulse shape, implied by the fast rise time, provides the highest available optical output power with respect to peak light flux at the diode facet and with respect to the heat generated in the laser diode, and also provides the highest available optical output power with respect to diode heat sink temperature.

Heretofore, applications for high power pulsed semiconductor lasers have been limited because of the difficulties in producing high current pulses of proper pulse shape and high repetition rate. Therefore, the present invention opens up new applications for those lasers since driving the lasers now becomes simplified. It is useful on all applications of pulsed semiconductor lasers and light emitting diodes where the pulse width is short and the current is high. It also is useful for applications involving a small, very low impedance, active electronic device and particularly where the required bandwidth is too high for conventional transmission line impedance matching techniques. One example of the latter is the acoustic bulk-wave transducer, which is a low impedance device capable of high bandwidth.

Therefore it is an object of the present invention to provide a laser diode package which matches the impedance of the diode to its power feed transmission line while providing heat sinking for the diode.

Another object is to provide a package which allows impedance matching of any electronic device which has a low impedance with a transmission line having a high characteristic impedance.

Another object is to provide a transmission line matching device which can be ruggedly constructed, can be cooled actively or passively, and will withstand environmental rigors.

Another object is to provide a transmission line matching device which is relatively economical to manufacture and requires no maintenance.

These and other objects and advantages of the present invention will become apparent to those skilled in the art after considering the following detailed specification together with the accompanying drawing wherein:

BRIEF DESCRIPTION OF THE DRAWINGS

FIG. 1 is a cross-sectional, partial side view of an impedance matching package constructed according to the present invention; and FIG. 2 is a partially cutaway front view of the device of FIG. 1; and FIG. 3 is a schematic circuit diagram of the present invention.

DETAILED DESCRIPTION OF THE SHOWN EMBODIMENT

Referring to the drawing, more particularly by reference numbers, number 10 in FIGS. 1 and 2 refers to an impedance matching package which can be used to match the characteristic impedance of a transmission line 12 to an electronic device having a much lower impedance such as a GaAs laser diode 14 as shown. The package 10 includes a body 16 carefully constructed from a metal having excellent thermal dissipation characteristics and high conductivity. Copper and silver are typical materials having these characteristics. The body 16 of the package 10 includes a torus shaped cutout 18 therein to define a center post 20. A ferrite toroid 22 is positioned within the cavity 18 with the center post 20 extending through the center 24 thereof. A typical toroid 22 would have a 0.1 inch diameter O.D., a 0.05 inch diameter I.D. and a 0.05 inch width.

The transmission line 12 is connected to the ferrite toroid 22 by a suitable coaxial cable connector 26 having the same characteristic impedance as the transmission line 12. When RG-196A/U is used as the transmission line 12, an Omni Spectra OSMM connector works well. The coaxial cable connector 26 extends from the transmission line 12 down through a bore 30 in the body 16 almost to the opposite end 31 thereof to a suitable twisted wire pair 32 which extends laterally in a second bore 34 which extends between the first bore 30 and the cutout 18. A conducting cover 35 is used to close the bore 30 at its end 31. The twisted pair 32 are actually the ends of a primary winding 36 wrapped about the ferrite toroid 22. The number of primary turns is chosen such as to match the characteristic impedance of the intended transmission line 12 as are the twists per unit length of the twisted pair 32. The wire 38 of the primary winding 36 is usually magnet wire having a wire gauge and insulation thickness chosen so that the twisted pair 32 has a characteristic impedance similar to that of the intended transmission line 12. 36 gauge wire with class 200 double build insulation is a typical primary winding material and when such is used, about 10 twists/inch generate the proper impedance. Since the twisted pair 32 is very short, an exact impedance match is not critical. The wire 38 is connected to the coaxial cable connector 26 by solder 40 or other suitable means at its ends 41a and 41b.

The electronic device to be driven such as the diode 14 is positioned on a flat 42 machined on the center post 20. The diode 14 is retained in position by suitable means such as indium, tin-lead alloy, or other suitable metal or alloy solder. A lid plate 46 is then soldered to the front face 47 of the body 16. The lid plate 46 is constructed from material having high electrical and heat conductivity such as copper, silver or any other suitable material. The lid plate 46 is formed with a frontwardly extending folded lip 48 which extends sidewards away from a cutout 50 shaped to clear but be closely adjacent the center post 20. The relatively massive center post 20 and the lip 48 provide double-sided heat sinking for the diode 14 so that it can be operated at high power levels and high repetition rates. The lip 48 is connected by suitable means such as solder to the laser diode 14 so that in effect the diode 14 is part of a single turn secondary 51 formed about the toroid 22 by the body 16, the lid plate 46, the lip 48, the diode 14 and the center post 20. The secondary 51 feeds power to the diode 14 for its operation and the transforming done between the primary and the secondary of the toroid 22 matches the impedance of the diode 14 to the transmission line 12. Since the connector 26 is in electrical contact with the body 16, the secondary 51 and one end 41a are grounded together. (FIG. 3)

As shown in FIGS. 1 and 2, the back 54 of the body 16 can be embedded in a more massive heat sink 56 to carry away heat. The heat sink 56 can in turn be passively cooled by fins (not shown) or actively cooled by coolant in a cooling coil 58 wrapped around the heat sink 56.

Although the package 10 has been described with relation to a laser diode 14, other electronic devices which require low loss impedance matching such as light emitting diodes, bulk wave transducers, and other devices where the feed pulse width is short and the current is high, can be mounted on the center post 20.

In the present example with a GaAs diode having an impedance of about 0.1 ohm, a 50 ohm transmission line, and a primary winding of 23 turns, the package 10 absorbs less than 5% of the power transmitted and offers a rise time of less than 5 nanoseconds without requiring excess drive voltage. Therefore bipolar or field-effect transistor output stages 60 can be used. Due to the double-sided heat sinking, the package 10 provides the highest available optical output power with respect to diode heat sink temperature known.

Thus there has been shown and described a novel impedance matching package concept for high current, low impedance devices which fulfills all of the objects and advantages sought therefor. Many changes, alterations, modifications and other uses and applications of the subject package concept will become apparent to those skilled in the art after considering this specification together with the accompanying drawing. All such changes, alterations and modifications which do not depart from the spirit and scope of the invention are deemed to be covered by the invention which is limited only by the claims which follow.

What is claimed is:

1. A device for matching the impedance of a transmission line to the impedance of an electronic device, said matching device including:
   a body of electrically conductive material having a first surface in which is defined a generally toroidal shaped cutout with a center post extending out of said first surface;
   a toroidal transformer positioned about said center post and in said defined generally toroidal shaped cutout having a primary winding thereabout and means for connecting said primary winding to the transmission line; and
   a cover positioned in electrical communication with said first surface and the electronic device to enclose said toroidal transformer with a single electrical loop including the electronic device, whereby said body and said cover form a secondary winding about said toroidal transformer connected to the electronic device.

2. The device for matching the impedance of a transmission line to the impedance of an electronic device as defined in claim 1 wherein said means for connecting said primary winding to the transmission line include:
   a pair of twisted leads.

3. The device for matching the impedance of a transmission line to the impedance of an electronic device as defined in claim 2 wherein said means for connecting said primary winding to the transmission line further include:
   a connector having first and second ends, said first end being adapted for connection to the transmission line and said second end being connected to said pair of twisted leads.

4. The device for matching the impedance of a transmission line to the impedance of an electronic device as defined in claim 3 wherein said body defines first and second bores therein, said second end of said connector being located in said first bore, said second bore extending from said first bore to said generally toroidal shaped cutout and said pair of twisted leads extending therethrough.

5. The device for matching the impedance of a transmission line to the impedance of an electronic device as defined in claim 4 wherein said connector has first and second polarity portions, said first polarity portion thereof being in electrical contact with said body.

6. The device for matching the impedance of a transmission line to the impedance of an electronic device as defined in claim 1 wherein said contact portion of said cover is formed by a fold in said cover.

7. The device for matching the impedance of a transmission line to the impedance of an electronic device as defined in claim 1 wherein said cover includes:
   a post cutout adjacent said center post so that said cover is in direct electrical contact only with said electronic device and said first surface about said center post.

8. The device for matching the impedance of a transmission line to the impedance of an electronic device as defined in claim 1 wherein the electronic device is a laser diode.

9. The device for matching the impedance of a transmission line to the impedance of an electronic device as defined in claim 8 wherein said center post includes a flat surface thereon adapted for connection to said laser diode.

10. The device for matching the impedance of a transmission line to the impedance of an electronic device as defined in claim 1 wherein said body includes a cooling coil connected thereto.

11. The device for matching the impedance of a transmission line to the impedance of an electronic device as defined in claim 1, wherein said center post is adapted for mounting a first polarity of the electronic device thereon and providing electrical contact therewith and said cover includes a contact portion adapted for mounting to a second polarity of the electronic device and providing electrical contact therewith.

* * * * *